United States Patent [19]
Agliata

[11] 4,093,371
[45] June 6, 1978

[54] COMPOSING MACHINE

[75] Inventor: Thomas P. Agliata, Rochester, N.Y.

[73] Assignee: Xerox Corporation, Stamford, Conn.

[21] Appl. No.: 725,899

[22] Filed: Sep. 22, 1976

[51] Int. Cl.² .................... G03B 27/52; G03B 27/70
[52] U.S. Cl. ......................................... 355/43; 352/89;
354/291; 355/45
[58] Field of Search ................ 355/14, 43, 44, 45,
355/40, 11, 5, 39, 75; 352/89; 354/77, 291

[56] References Cited
U.S. PATENT DOCUMENTS

| | | | |
|---|---|---|---|
| 1,945,926 | 2/1934 | Tolhurst | 352/89 X |
| 2,920,526 | 1/1960 | Shearer | 354/291 X |
| 3,220,792 | 11/1965 | Vendig | 352/89 |
| 3,872,462 | 3/1975 | Lemelson | 355/45 X |

Primary Examiner—Richard A. Wintercorn
Attorney, Agent, or Firm—J. J. Ralabate; C. A. Green; H. Fleischer

[57] ABSTRACT

A composing machine in which successive original documents have selected portions thereof masked. The unmasked portions of each original document are displayed and reproduced, in registration with one another, forming a composite copy from the unmasked portions of each original document.

The foregoing abstract is neither intended to define the invention disclosed in the specification, nor is it intended to be limiting as to the scope of the invention in any way.

7 Claims, 3 Drawing Figures

COMPOSING MACHINE

BACKGROUND OF THE INVENTION

This invention relates generally to a composing machine, and more particularly concerns the display and reproduction system thereof.

In a composing machine, an original document is disposed on a support and illuminated so that a light image thereof may be readily displayed upon a viewing screen. Generally, position indicia are also reproduced on the viewing screen. This enables the size and location of the displayed image to be varied. When the position and size of the displayed image have been adjusted to provide the required information on the viewing screen, the operator may depress the appropriate button and reproduce the selected portions of the original document. This is accomplished frequently by projecting the selected portions of the light image onto a sensitized surface. Thus, only the selected portions of the original document are reproduced thereon. In order to achieve the foregoing, it is necessary to mask selected portions of the original document so that only the desired portions thereof are reproduced.

By way of example, U.S. Pat. No. 3,732,009 issued to Callum in 1973 discloses a photocomposing machine for use in preparing printing plates. In a machine of this type, the text is prepared on a master sheet which is mounted on a carrier. The carrier has the printed material desired to be reproduced correctly positioned thereon as it passes through the machine. A masking mechanism is provided to eliminate selected portions of the original document from the copy. A control system regulates the drive mechanism so that the carrier, textural material and masks move in synchronism with one another.

In various industries, it is common to compose a page of material by pasting together separate items of prepared text. The pasted-up page is then used as a starting point for making a corresponding printing plate by photographic and photoetching techniques. A layout department is required to allocate space on the page to each particular item thereof. Conventionally, the prepared copy is pasted onto an allocated section of a particular page. Rather than accomplishing the layout process manually, a computer may be employed to store layout information for each page. The material, including the art work, is scanned to provide numerical data necessary for controlling a reproducing machine. The textural material is edited on an editing terminal and then stored with or without the reproducing instructions in the computer. Each item to be included on the page is identified and the computer is instructed as to where each item is to be positioned thereon. The foregoing is described in U.S. Pat. No. Re. 27,974, issued to Kolb in 1974. The system disclosed therein, employs a laser to read the material. Electronics, actuated by the laser beam and reflected from the material, provide the requisite information to the computer. Other systems for producing illustrated texts are also basically composing types of machines. Machines of this type may employ cathode ray tubes. For example, U.S. Pat. No. 3,796,487, issued to Lemelson in 1975, describes a cathode ray tube system used to compose and fill out forms with variable data.

In general, a composing machine accepts inputs or groups of information from different sources. The information is arranged and integrated in reference and registration with one another according to an operator preference. This forms a composed or composite output suitable for input to a reproduction machine. The machine may have the capability of editing and justifying as well as grouping and intermixing information. However, the foregoing is extremely complex and a basic composing machine should provide an acceptance of hard document originals of the type commonly inputed to a copying machine, e.g., written documents such as books, paste-ups, etc. The machine should be capable of arranging the information in mutually perpendicular directions as well as being able to rotate the information. In addition, the machine should provide the capability of being able to act upon the entire or selected portions of each document being processed. Moreover, magnification and minification of the information either in a continuous fashion or in discrete steps should be provided. The information should be able to be registered in a variety of ways so that different groups of information may be formed from the same input information. Functionally, the information should be capable of being color highlighted. Half-tone and solid area output information should be provided. A machine with these capabilities is readily operable and provides good quality, hard copy outputs suitable for input to present and forseeable high speed duplicating and copying machines.

Accordingly, it is a primary object of the present invention to provide a basic composing machine arranged to form composite original documents from selected information contained in a plurality of input original documents.

SUMMARY OF THE INVENTION

Briefly stated, and in accordance with the present invention, there is provided a composing machine for forming, displaying and reproducing a composite original document.

Pursuant to the features of the present invention, the composing machine includes means for supporting successive original documents. Means are provided for masking selected portions of each original document. Projecting means form a light image of the unmasked portions of each original document. This light image is displayed on a viewing screen. Means reproduce the portions of the original documents displayed on the viewing screen.

BRIEF DESCRIPTION OF THE DRAWINGS

Other objects and advantages of the present invention will become apparent upon reading the following detailed description and upon reference to the drawings, in which.

While the present invention will hereinafter be described in connection with a preferred embodiment and method of use therefor, it will be understood that it is not intended to limit the invention to that embodiment or method of use. On the contrary, it is intended to cover all alternatives, modifications and equivalents as may be included within the spirit and scope of the invention as defined by the appended claims.

DETAILED DESCRIPTION OF THE INVENTION

Figure 1:
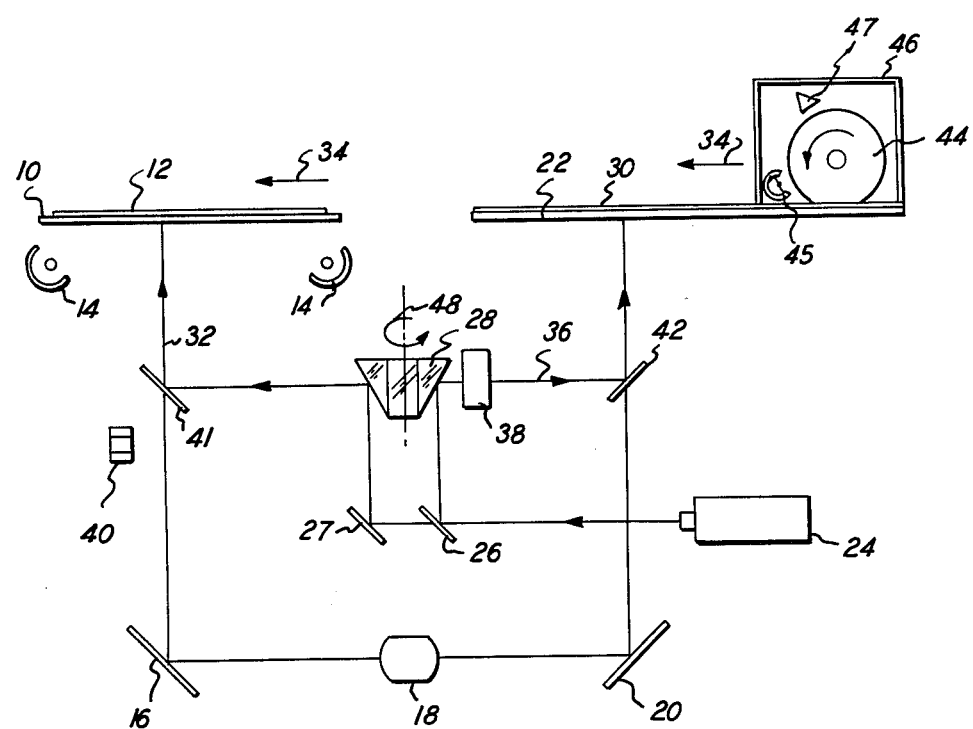
FIG. 1 is a schematic elevational view depicting a composing machine incorporating the features of the present invention therein.

For a general understanding of a composing machine in which the features of the present invention may be incorporated, reference is had to FIG. 1 which depicts schematically an elevational view of the various components employed therein. Hereinafter, like reference numerals will be utilized throughout to designate identical elements.

Referring now to FIG. 1, the composing machine employs a transparent platen 10 supporting original document 12 thereon. Lamps 14 illuminate the original document. The light rays reflected from original document 12 are reflected by mirror 16 through lens 18. Lens 18 forms a light image of original document 12. Mirror 20 then reflects the light image in an upwardly direction onto viewing screen 22. To achieve this, original document 12 is positioned face down on platen 10 with an image of the document being visible to the operator on screen 22. The operator can translate or rotate the document and observe similar motions of the image. This allows the operator to position the information as desired. The magnification of the optical system may be adjusted in discrete steps or by employing a zoom lens so that the light image displayed on screen 22 is as desired.

Laser 24 must be adjusted so as to magnify or minify the resultant copy. Increasing the length of the beam path magnifies the information reproduced while reducing the length of the beam path magnifies or reduces the information reproduced. Penta mirrors may be employed for mirrors 41 and 42 to adjust the length of the beam path. A variable size and shape masking mechanism is positioned closely adjacent to platen 10. The masking mechanism permits the operator to omit selected areas from original document 12. This mechanism may simply be a transparent sheet entrained about a pair of opposed spaced rollers. During masking, the original document is placed face up beneath the upper transparent sheet. This enables the operator to place opaque strips on the transparent sheet masking selected portions of the original document. Thereupon, original document 12 is removed from the transparent sheet. The transparent sheet is advanced by the rollers onto platen 10 and the original document positioned face down thereover in registration with the opaque strips thereon. Thus, only the unmasked portions of the original document will be displayed on screen 22. Screen 22 is adapted to retain the light image thereon for a preselected period of time. This permits successive original documents to be masked and projected onto screen 22 so that the unmasked portions thereof are in registration with one another forming a composite original document thereon. If it is not feasible to retain the light image on screen 22, each masked portion of each original document may be allocated a specific area of screen 22 and displayed thereon sequentially. When the operator is satisfied that each original document is properly positioned and masked, a process button is depressed. This activates laser 24 which simultaneously reads the unmasked portion of original document 10 and writes it onto the plane of viewing screen 22 which contains a recording sheet. The beam from laser 24 is projected onto beam splitter 26. Beam splitter 26 forms two beams, a read beam and a write beam. Mirror 27 reflects the read beam onto scanner 28 and beam splitter 26 reflects the write beam onto scanner 28. Preferably, scanner 28 is a truncated polygon having a multifaceted reflecting surface so as to project a scan plane across incremental widths of both recording member 30 and original document 12 as it rotates in the direction of arrow 48. By way of example, scanner 28 may have 12 facets. The number of facets and angular velocity of scanner 28 define the number of lines scanned per revolution. The foregoing is shown more clearly in FIGS. 2 and 3. Read beam 32 is reflected by mirror 41 onto the surface of original document 12. Original document 12 moves in the direction of arrow 34 so that the entire original document is scanned by read beam 32. This is achieved by advancing platen 10 with original document 12 thereon in the direction of arrow 34. A suitable drive mechanism achieving the foregoing may be a rack and pinion assembly. Similarly, recording member 30 is driven in synchronism with the movement of original document 12 so that the write beam projected thereon records the information contained within the masked portions of original document 12 thereon. It should be noted that recording member 30 moves at the same speed as platen 10 when the copy is to be the same size as the original. Contrawise, if the platen moves faster than the recording member the copy will be magnified, while if the platen moves slower than the platen, the copy will be minified. Platen speed and laser beam path must be coordinated to control copy size in a plane. The beam path length controls copy size in one direction while platen speed controls copy size in a direction normal thereto. Write beam 36 is modulated by modulator 38. This is achieved by reflection detectors 40. Reflection detectors 40 measure the intensity of the beam reflected from original document 12. The detectors develop a signal which controls modulator 38. Modulator 38 is biased such that when detectors 40 sense background (high reflection) write beam 36 is turned off. When information is sensed (low reflection) the write beam is on. This results in the write beam forming an image on the recording member corresponding to the informational areas contained within the unmasked portions of original document 12 disposed on platen 10. Write beam 36 is reflected by mirror 42 onto recording member 30 to form the image thereon.

While the write scan is being executed, a precharged, pre-heated sheet of photosensitive material, i.e., recording member 30, is rolled onto viewing screen 22. This sheet moves in synchronism with the scan of original document 12 and comprises a manifold recording set. The manifold recording set comprises photoresponsive material interposed between a pair of insulating sheets. In this imaging system, an imageable plate is prepared by coating a layer of cohesively weak photoresponsive imaging material onto a substrate. This coated substrate is termed a donor. In preparation for the imaging operation, the imaging layer is usually activated by treating it with a swelling agent or partial solvent for the material or by heating. Once the imaging layer is activated, a receiving sheet is layed over its surface. An electrical field is then applied across the manifold set while it is exposed to a pattern of light and shadow representative of the image being reproduced. Upon separation of the donor substrate and the receiving sheet, the imaging layer fractures along the lines defined by the pattern of light and shadow to which the imaging layer has been exposed, with part of the imaging layer being transferred to the receiving sheet and the remainder being retained on the donor sheet. Thus, a positive image, that is, a duplicate of the original is produced on one sheet while a negative image is produced on the other sheet. Either the donor sheet or receiver sheet must be at least partially transparent to permit exposure of the imaging material to the image to be reproduced. The imaging layer serves a dual function of imparting light sensitivity to the system while at the same time acting as a colorant for the final image produced. A detailed description of a manifold system may be found in U.S. Pat. No. 3,876,937, issued to Kamola in 1975, the relevant portions thereof being hereby incorporated into the present application. Thus, recording member 30 comprises a receiver sheet and a donor sheet entrained about a drum 44. Corona generating device 45 charges the manifold sheet as it is advanced in the direction of arrow 34. Heater 47 is incorporated within housing 46 to preheat the manifold recording set. Preferably, heater 47 is a resistance type of heating element.

In operation, successive masked images of successive original documents are recorded, in registration, on recording member 30. However, in lieu thereof, a plurality of successive separations may be formed. Thus, one portion of recording member 30 may have the information contained within the first original document and another recording member may have the information contained within the second original document. In this manner, separation masters are created rather than a single copy. Hence, the information contained within each original document is positioned on each separation master. Contrawise, the information contained within all the original documents, i.e., the unmasked portions thereof, may be superimposed onto a common recording sheet to form a composite copy thereof. This requires that recording member 30 be returned to its initial position after each original document is scanned so as to place the information contained thereon in the correct registration, i.e., recording member 30 must be reciprocated. For example, if the first document is removed and the second placed on platen 10, the optical system is once again activated and the operator may translate, rotate, magnify and otherwise position the information from the second document relative to the information from the first document which was fixed to the transparent receiving sheet by the manifold process. After proper masking and positioning of the new information, the process button is once again depressed and the read and write sequence heretofore described commenced. The manifold process fixes the second group of information in registration with the first. The above process continues until the composite original document is completed.

If the composite original document is of a single color, a single sheet of manifold material would be sufficient to create the entire composite original document regardless of the number of passes required. Contrawise, if a highlight color were desired for portions of the composite original document, the operator would have to select a sheet of appropriately pigmented manifold material for use during the processing of that portion of the creation of the composite original document.

Once the composite original document is completed, the operator removes the transparent sheet. This transparent sheet, with the information thereon, may serve as a master input to a high speed copier or as an input to an overhead projector.

Figure 2:
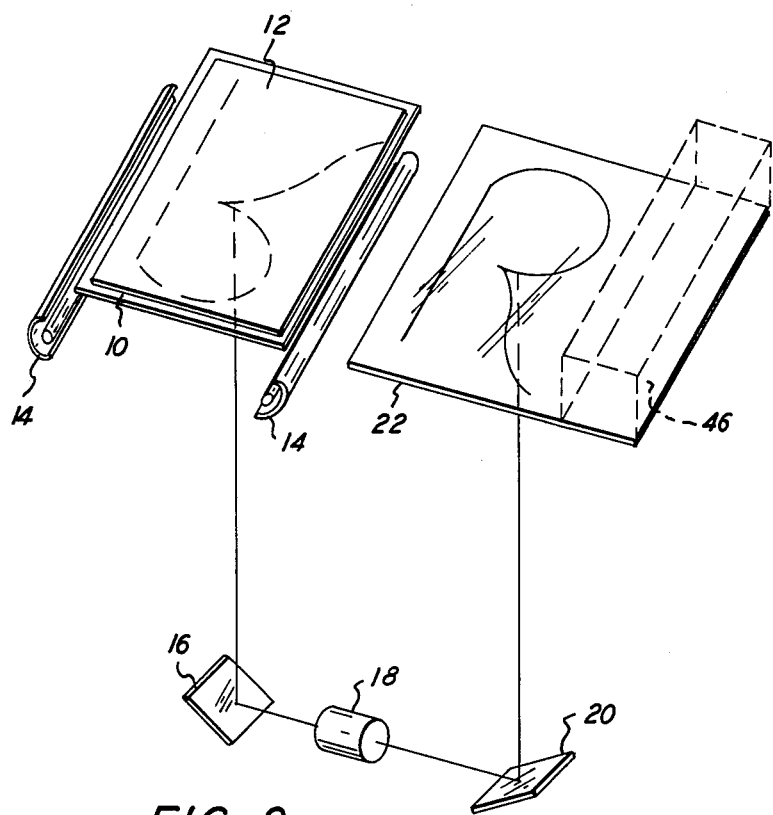
FIG. 2 is a schematic perspective view showing the display system of the FIG. 1 composing machine.

Turning now to FIG. 2, there is shown, in greater detail, the display system for the FIG. 1 composing machine. Lamps 14 illuminates original document 12 disposed on transparent platen 10. The light rays reflected from original document 12 are transmitted through platen 10 onto mirror 16. Mirror 16 directs the light rays through lens 18 which, preferably, is a variable magnification lens. The light image transmitted through lens 18 is then reflected by mirror 20 in an upwardly direction onto screen 22. Preferably, screen 22 is a translucent material adapted to display the light image transmitted thereto. However, if a period of storage is required, a suitable photochromic material may be used in lieu thereof. The photochromic material would have a specified fatigue time such as to enable the operator to project successive masked portions thereon. In this way, the operator would see the composite image formed on screen 22. Contrawise, if a translucent material were to be employed, only successive unmasked portions of the original documents would be displayed thereon rather than the total composite image. In the event a translucent material were to be employed, specific areas of screen 22 would have to be assigned to each unmasked portion of each original document being employed to form the composite copy. As previously noted, original document 12 is interposed face up beneath a transparent sheet. The transparent sheet (not shown) is entrained about a pair of opposed spaced rollers. In this way, the operator may position opaque strips on the transparent sheet so as to mask selected portions of the original document. Thereafter, the original document is positioned face down over the transparent sheet which moves over platen 10 so that the masked portions thereof are not displayed on screen 22.

Figure 3:
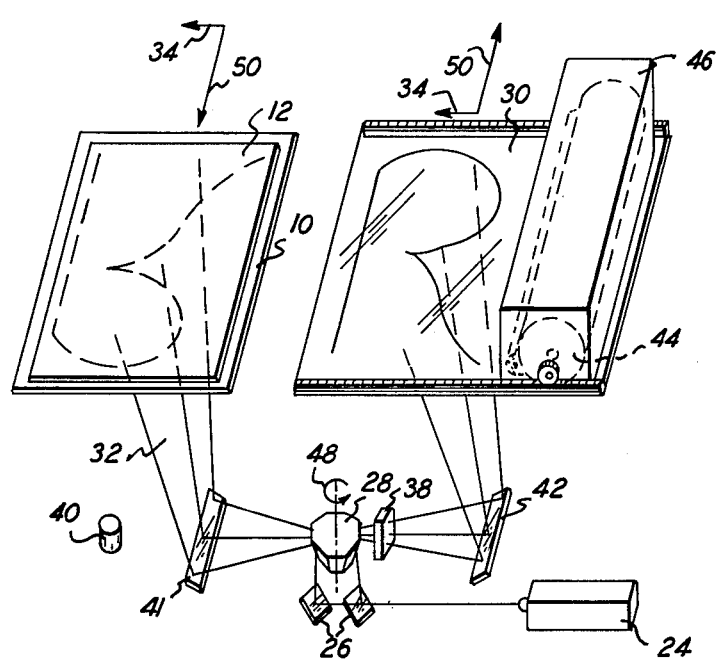
FIG. 3 is a schematic perspective view illustrating the reproducing system of the FIG. 1 composing machine.

Referring now to FIG. 3, there is shown the reproducing system of the FIG. 1 composing machine. As illustrated therein, laser 24 projects a beam onto beam splitter 26. Beam splitter 26 and mirror transmit a read beam and a write beam onto scanner 28. Scanner 28 is a truncated polygon having a plurality of multi-faceted reflecting surfaces. A motor rotates scanner 28 in the direction of arrow 48. Read beam 32 is reflected by mirror 41 onto original document 12 through transparent platen 10. As scanner 28 rotates, read beam 32 moves in the direction of arrow 50 defining a read plane. Original document 12 moves in the direction of arrow 34 so that successive incremental widths thereof may be scanned by read beam 32. The read beam reflected from original document 12 is sensed by reflection detectors 40. Preferably, reflection detectors 40 are photodiodes which develop an electrical output signal indicative of the informational areas contained within the original document. The electrical output signal from reflection detector 40 is transmitted to modulator 38. Modulator 38 is biased such that when reflection detector 40 develops an electrical signal indicating that there is background, i.e., a white portion having high reflection, write beam 26 is de-energized. Contrawise, when reflection detector 40 sensed a low reflection, i.e., the informational areas contained within the original document, modulator 38 permits beam 36 to be transmitted onto recording member 30. Preferably, modulator 38 is an acousto-optical or electro-optical device which acts as a fast switch. Generally, a device of this type includes a crystal which reacts to sound or an electrical field to transmit or not transmit light. A suitable modulator is made by the Isomet Corporation of Springfield, Va. Write beam 36 is reflected by mirror 42 through viewing screen 22 onto recording member 30. Recording member 30 is advanced by a rack 48 and pinion gear (not shown) meshing therewith and driven by a motor in the direction of arrow 34, in synchronism with the movement of original document 12. The rotation of scanner 28 in the direction of arrow 48 causes a write beam 36 to scan across recording member 30 defining a plane extending in the direction of arrow 52. In this way, an incremental width of information is recorded on recording member 30. As previously indicated, recording member 30 is a manifold recording set entrained about a drum 44. Corona generating device 54 charges recording member 30 to a prescribed level. Heater 47 raises the temperature of recording member 30 sufficiently so as to enable the imaging layer to be transferred from the donor sheet to the receiving sheet when activated by write beam 36. Recording member 30, in the negative working mode, is capable of up to 20 lines/milimeter with a maximum density of 1.0 to 1.5 and a minimum density of essentially 0. The recording member is moderately fast, i.e., 3 to about 10 crgs/cm.$^2$ with a peak sensitivity of about 600 nanometers. The recording member may operate at a process speed of about 10 to about 30 inches/second. Moreover, it has a high slope of the density versus exposure graph (gamma) so as to be capable of good halftones. In addition, the solid area coverage is excellent. The 600 nanometer sensitivity peak of the manifold recording set permits the use of a helium neon laser. This type of laser is reliable, well behaved and less expensive than most other types of lasers. Inasmuch as the manifold set may be formed from pigments having different colors, the composite original document may have color highlighted regions therein.

In recapitulation, it is evident that the composing machine permits the operator to mask selected portions of successive original documents to form a composite which may be displayed on a viewing screen. This composite is then reproduced on a recording member wherein selected portions thereof may be color highlighted. The reproduction of the composite may then be employed as a master in a high speed copying machine so as to create a plurality of copies thereof.

It is, therefore, evident that there has been provided in accordance with the present invention, a composing machine which fully satisfies the objects, aims and advantages herein before set forth. While this invention has been described in conjunction with a specific embodiment and method of use therefor, it is evident that many alternatives, modifications and variations will be apparent to those skilled in the art. Accordingly, it is intended to embrace all such alternatives, modifications and variations as fall within the spirit and broad scope of the appended claims.

What is claimed is:

1. A composing machine, including:
    means for supporting successive original documents;
    means for masking selected portions of each original document disposed on said supporting means;
    a viewing screen;
    means for projecting the unmasked portions of each original document onto said viewing screen to display successive portions of each original document thereon, said projecting means comprises a light source for illuminating each original document disposed on said supporting means, a lens, first means for directing the light rays reflected from successive masked original documents through said lens forming a light image of the unmasked portion of each original document, and second means for directing the light image of the unmasked portion of each original document onto said viewing screen to be displayed thereon; and
    means for reproducing the portions of each original document being displayed on said viewing screen.

2. A machine as recited in claim 1, wherein said reproducing means includes:
    a laser arranged to transmit a beam therefrom;
    means for splitting the beam from said laser into read and write beams;
    a beam responsive recording member positioned to receive the write beam;
    means for scanning the read beam across the original document and the write beam across said recording member;
    means for detecting the read beam transmitted from the original document and generating a signal indicative thereof; and
    means, responsive to the signal from said detecting means, for modulating the write beam to form the information of the unmasked portion of each original document on said recording member.

3. A machine as recited in claim 2, further including:
    means for moving each original document in plane substantially normaly to the plane defined by said read beam during scanning of the original document; and
    means for moving said recording member in a plane substantially normal to the plane defined by said write beam.

4. A machine as recited in claim 3, wherein said recording member includes a substantially transparent sheet having the information of the unmasked portions of each original document formed thereon.

5. A method of composing a composite original document, including the steps of;
    supporting successive original documents;
    masking selected portions of each original document being supported;
    projecting the unmasked portions of each original document onto a viewing screen to display unmasked portions of each original document thereon, said step of projecting comprises the steps of illuminating each original document being supported, forming a light image of the unmasked portions of each original document from the light rays reflected therefrom, and directing the light image of the unmasked portion of each original document onto the viewing screen to be displayed thereon; and reproducing the portions of each original document being displayed on the viewing screen.

6. A method as recited in claim 5, wherein said step of reproducing includes the steps of:
    energizing a laser to generate a beam;
    splitting the laser beam into read and write beams;
    directing the read beam onto a recording member;
    scanning the read beam across each original document and the write beam across the recording member;
    detecting the read beam transmitted from the original document and generating a signal indicative thereof; and
    modulating the write beam, in response to the detected signal, to form the information of the unmasked portion of each original document on the recording member.

7. A method as recited in claim 6, further including the steps of:
    moving each original document in a plane substantially normal to the plane defined by the read beam during scanning of the original document; and
    moving the recording member in a plane substantially normal to the plane defined by the write beam.

* * * * *